United States Patent [19]

Padgett

[11] 3,736,522

[45] May 29, 1973

[54] HIGH GAIN FIELD EFFECT TRANSISTOR AMPLIFIER USING FIELD EFFECT TRANSISTOR CIRCUIT AS CURRENT SOURCE LOAD

[75] Inventor: Clarence W. Padgett, Huntington Beach, Calif.

[73] Assignee: North American Rockwell Corporation, El Segundo, Calif.

[22] Filed: June 7, 1971

[21] Appl. No.: 150,492

[52] U.S. Cl. ........................330/35, 307/251, 330/28

[51] Int. Cl. ..................................................H03f 3/16

[58] Field of Search ......................337/15, 25, 28, 35, 337/38 M; 307/251, 304

[56] References Cited

UNITED STATES PATENTS 3,660,684 5/1972 Padgett et al. ....................207/251 X 3,604,952 9/1971 Regitz..............................307/251 X 3,506,851 4/1970 Pockinghorn et al. ...............307/251

*Primary Examiner*—Roy Lake

*Assistant Examiner*—James B. Mullins

*Attorney*—L. Lee Humphries and H. Fredrick Hamann

[57] ABSTRACT

The amplifier drives one half of a push-pull output stage and receives voltage changes fedback from the output to regulate the output voltage. The amplifier has a current source in electrical series with a regulating field effect transistor which is controlled by the output feedback. The push-pull output stage is driven by a voltage level at a common point between the current source and the regulating field effect transitor. Due to the high gain characteristics of the amplifier, the voltage changes at the common point are large relative to the voltage changes on the gate electrode of the regulating field effect transistor. As a result, relatively small output changes are quickly corrected by changing the drive voltage for the field effect transistor push-pull circuit.

3 Claims, 2 Drawing Figures

INVENTOR
CLARENCE W. PADGETT
BY Robert G. Rogers
ATTORNEY

Patented May 29, 1973 3,736,522

2 Sheets-Sheet 1

INVENTOR
CLARENCE W. PADGETT
BY Robert G. Rogers
ATTORNEY

HIGH GAIN FIELD EFFECT TRANSISTOR AMPLIFIER USING FIELD EFFECT TRANSISTOR CIRCUIT AS CURRENT SOURCE LOAD

BACKGROUND OF THE INVENTION

1. Field of the Invention

The invention relates to a high grain field effect fransistor amplifier for driving a field effect transistor push-pull output stage and more particularly to such an amplifier in which a field effect transistor constant current source circuit and a regulating field effect transistor which receives feedback voltages from the output provide relatively high drive voltages to the push-pull output in response to output voltage changes which can be relatively small.

2. Description of Prior Art

Driver circuits ordinarily must be made large enough to permit a rapid charge and discharge of the capacitance at various nodes within the circuit. In addition, the field effect transistor devices of the circuit are required to remain on relatively long periods of time so that power consumption in operating the circuit is substantially increased. In certain embodiments, the voltage levels, either negative or positive, are relatively large so that additional time and power are consumed in charging and/or discharging the output load capacitances as well as the capacitances at each node of the circuit each time the voltage levels are changed during the operation of the circuit.

Most driver circuits operate cyclically such that during one phase, an output is precharged to a desired voltage level representing a first logic state. During a subsequent phase time, the output is either changed to a second voltage level representing a second logic state or it remains unchanged as a function of an input voltage. Inverting and noninverting circuits can be implemented.

SUMMARY OF THE INVENTION

The present driver circuit provides the necessary functions of a driver circuit while substantially minimizing the power consumption, increasing speed, and reducing the output voltage level from relatively high to relatively low voltage levels which are referenced to the threshold voltage levels of the field effect transistors implementing the driver circuit and other circuits formed simultaneously in the same semiconductor chip. In addition, a control circuit is used for enabling the driver output to be conditionally noded with other like driver circuits. A relatively high voltage gain amplifier is used by the driver circuit for amplifying relatively small changes on the output for increasing the drive voltage for a push-pull operated output field effect transistor. The increased drive quickly restores, i.e. regulates, the voltage at the output within a usable range so that the output does not float and is therefore less susceptible to noise voltages.

Briefly, the invention comprises a relatively high gain field effect transistor amplifier including a field effect transistor current source circuit connected in electrical series with a regulating field effect transistor. The gate electrode of the regulating field effect transistor receives feedback voltage changes from an output between two field effect transistors connected in a push-pull arrangement. One driver circuit embodiment uses the high gain amplifier as part of an output precharge circuit providing drive voltage for one half of the push-pull output stage during one phase of a multiphase operating cycle synchronized by multiple phase clock signals. The drive voltage is taken from a common point between the current source and the regulating field effect transistor. The driver circuit embodiment also includes an input evaluation circuit providing drive voltages to the other half of the push-pull output stage during another phase of the multiphase operating cycle. The output remains set or is reset to a voltage level as a function of the input voltage level. In the preferred embodiment, the output voltage is not inverted from the input.

The preferred driver embodiment also includes circuits for disabling the precharge circuit during certain operational phases so that the output can rapidly change without unnecessary power dissipation and to isolate the output from other like driver circuits when it is desired to node, i.e. electrically connect, the output to other like driver circuits.

Therefore, it is an object of this invention to provide a relatively high gain voltage amplifier for regulating the voltage level of an output during certain phases of a multiphase operational cycle during which the output is set to a voltage level representing an input voltage level.

It is another object of this invention to provide an improved high voltage gain amplifier circuit implemented with a constant current source field effect transistor circuit connected in electrical series with a regulating field effect transistor which receives feedback voltage changes from an output terminal for providing a drive voltage to a field effect transistor for comprising one half of a push-pull output stage.

Still another object of this invention is to provide an improved push-pull field effect transistor output driver using a field effect transistor high gain amplifier receiving feedback voltage changes from the output and which includes a field effect transistor for enabling the output to be conditionally noded with other like circuits.

Another object of this invention is to provide an improved field effect transistor output driver circuit which can more quickly discharge the output load capacitance from a first logic state to a second logic state as a function of the input logic level during certain phases of the multiphase operational cycle.

A still further object of this invention is to provide an improved field effect transistor output driver circuit which includes a feedback circuit from the output for compensating for changes in the output voltage level due to noise etc.

These and other objects of this invention will become more apparent when taken in connection with the description of the drawings, a brief description of which follows.

DESCRIPTION OF PREFERRED EMBODIMENT

Figure 1:
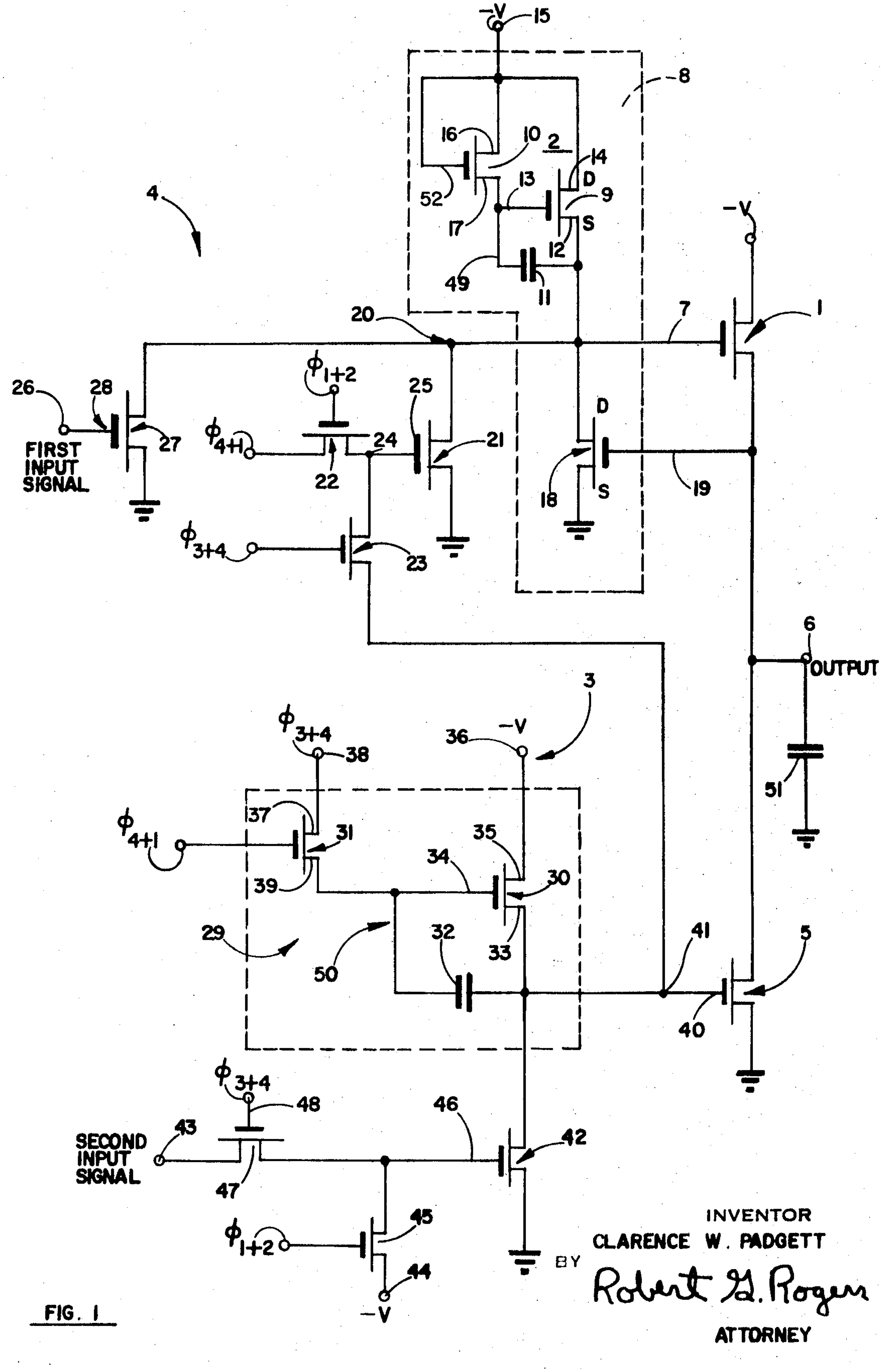
FIG. 1 is a schematic diagram of one embodiment of the high gain amplifier used in a driver circuit embodiment, having a push-pull output stage, for evaluating input signals and for permitting the output to be noded with like circuits as required for certain operating conditions.

FIG. 1 illustrates a field effect transistor driver circuit including a push-pull stage comprising field effect transistors 1 and 5 connected between voltage level −V and electrical ground. Output terminal 6 is connected at a common point between the field effect transistors. Capacitor 51 represents the output load capacitance between output terminal 6 and electrical ground.

The driver circuit includes an output precharge circuit 4 and an input evaluation circuit 3 which provide drive voltages to gate eledtrodes 7 and 40 of field effect transistors 1 and 5 respectively, during certain phases of the multiphase operational cycle of the driver circuit. Multiple phase clock signals $\phi_{1+2}$, $\phi_{3+4}$, and $\phi_{4+1}$ regulate the operation of the circuit. $\phi_{2+3}$is not used in the embodiment shown although in other embodiments the $\phi_{2+3}$ signal may be used in lieu of voltage sources or for clocking purposes as appropriate to implement a particular embodiment.

The precharge circuit 4 utilizes a high voltage gain circuit comprising a constant current source circuit 2 connected in electrical series with an output regulating field effect transistor 18 between voltage source −V on terminal 15 and electrical ground. The gate electrode 19 of field effect transistor 18 is electrically connected to the output 6. As a result, output voltage changes are fedback to the high gain amplifier 8 for regulating the drive voltage on the gate electrode 7 of field effect transistor 1.

The precharge circuit 4 also comprises field effect transistors 22 and 21. Field effect transistor 21 is connected between node 20 and electrical ground and has its gate electrode 25 connected to field effect transistor 22 which is clocked or gated by major phase clock signal $\phi_{1+2}$ connected to its gate electrode. The field effect transistor 22 is connected in series between node 24 and major phase clock signal $\phi_{4+1}$. The field effect transistors 21 and 22 control the voltage level at node 20 during certain operational phases of the circuit as described in more detail subsquently.

The precharge circuit 4 also includes field effect transistor 27 connected between node 20 and electrical ground. Its gate electrode 28 is connected to terminal 26 which receives a control signal for permitting the precharge circuit to operate normally,i.e.,provide a precharge voltage on output 6 or, to disable the precharge circuit 4 when the output 6 is required to be noded, i.e., electrically connected, to another drive circuit like the FIG. 1 circuit.

Field effect transistor 23, having its gate electrode connected to the major phase clock signal $\phi_{3+4}$, is connected between node 24 and node 41 for disabling the precharge circuit 4 during certain phases of the operational cycle of the FIG. 1 circuit. The precharge circuit 4 is disabled to permit the charge on capacitor 51 to discharge through field effect transistor 5 during $\phi_4$ (phase four) as a function of the voltage level on the input terminal 43 as described in more detail subsequently.

The input evaluation circuit 3 comprises a bootstrap drive circuit 29 connected to node 41 for providing a drive voltage to the gate electrode 40 of field effect transistor 5. The bootstrap drive circuit is connected in electrical series with field effect transistor 42.

The input evaluation circuit also includes field effect transistor 47 connected between input terminal 43 and the gate electrode 46 of field effect transistor 42 for enabling gate electrode 46 to be precharged, for certain operational embodiments, during $\phi_3$ and for enabling the voltage level on terminal 43 to be evaluated during $\phi_4$. The field effect transistor 47 is held on during $\phi_{3+4}$ by the clock signal applied to its gate electrode 48.

During $\phi_{1+2}$, field effect transistor 45 is turned on to provide the voltage level −V (on terminal 44) to be connected to the gate electrode 46 of field effect transistor 42. Field effect transistor 45 provides a function similar to field effect transistors 22 and 21 of the precharge circuit 4.

The bootstrap drive circuit 29 of the input evaluation circuit 3 comprises field effect transistors 31 and 30 and capacitor 32 connected between the source electrode 33 and the gate electrode 34 of transistor 30. Drain electrode 35 of transistor 30 is connected to terminal 36 for voltage source −V. The drain electrode 37 of transistor 31 is connected to terminal 38 for the $\phi_{3+4}$ clock signal and source electrode 39 is connected to the gate electrode 34 of transistor 30. The gate electrode of transistor 31 is connected to the$\phi_{4+1}$ clock signal.

The high voltage gain amplifier 8 of the precharge circuit 4 comprises field effect transistors 9 and 10 and feedback capacitor 11 connected between source electrode 12 and gate electrode 13 of field effect transistor 9. Drain electrode 14 of the transistor is connected to terminal 15 for voltage −V. Field effect transistor 10 has its source electrode 17 connected to the gate electrode 13 of transistor 9, and its gate electrode 52 and drain electrodes 16 connected to terminal 15.

The operation of the FIG. 1 circuit is initially described for its normal operation,i.e., with field effect transistor 27 off. During $\phi_1$, field effect transistor 22 is turned on for rendering field effect transistor 21 conductive. Node 20 is therefore connected to electrical ground so that capacitor 11 charges to approximately −V reduced by the threshold drop across field effect transistor 10. During $\phi_2$, field effect transistor 22 remains on. However, the $\phi_{4+1}$ clock signal is false during $\phi_2$ so that field effect transistor 21 is turned off by transistor 22. Node 20 is driven toward −V by the current source circuit 2. The drive voltage at node 20 is also provided to gate electrode 7 of field effect transistor 1 for driving the output 6 toward −V. However, the increase in voltage at node 20 is fedback across capacitor 11 to the gate electrode 13 of field effect transistor 9 for maintaining a relatively constant conduction of field effect transistor 9. As the conduction of transistor 9 is enhanced, the voltage at node 20 is increased so that it is essentially equal to the voltage −V at terminal 15. The circuit action just described is often referred to as bootstrapping, i.e., the voltage at one electrode of a field effect transistor is fedback across a capacitor to increase the gate voltage of the field effect transistor for decreasing the voltage drop across the field effect transistor.

The voltage at the output 6 also provides a drive voltage on gate electrode 19 of field effect transistor 18 for rendering it conductive. The resistance ratio between the constant current source circuit 2 and more specifically field effect transistor 9 of that circuit, and field effect transistor 18 is selected to establish the desired output voltage at the output during $\phi_2$. An output voltage level in excess of one threshold is required to render field effect transistor 18 conductive.

When field effect transistor 18 is conductive, the voltage at node 20 is reduced to one threshold voltage greater than the desired low level voltage at output 6. Ordinarily, the drive voltage at node 20 of less than three thresholds is sufficient. When the voltage at node 20 is reduced by the feedback from output 6 to the transistor 18, the change is fedback across capacitor 11 to the gate electrode 13 of field effect transistor 9 to reduce the voltage on the gate electrode 13 by approximately the same voltage change that occurred at node 20. As a result, the output is quickly precharged during phase 2 to approximately two threshold voltage levels and node 20 is maintained at approximately three threshold voltage levels. Node 49, i.e., gate electrode 13, is bootstrapped and maintained in excess of four threshold voltage levels. The precharge circuit remains inthe steady state condition described at the end of phase two until a subsequent phase of operation or until the voltage at the output 6 changes due to, for example, electrical noise. The regulation effect is described subsequently following the description of the input evaluation circuit 3.

During $\phi_{1+2}$, field effect transistor 45 of the input evaluation circuit is turned on for connecting approximately −V to the gate electrode 46 of field effect transistor 42. As a result, node 41 is connected to electrical ground. During $\phi_2$, field effect transistor45 remains on and field effect transistor 5 remains off. As a result, field effect transistor 1 can be turned on as previously described to precharge the output 6. In other words, capacitor 51 at the output 6 is precharged during $\phi_2$ and field effect transistor 5 is held off.

During $\phi_3$, field effect transistor 45 is turned off since $\phi_{1+2}$ is false. Field effect trandistor 47 is turned on by $\phi_{3+4}$. For the particular embodiment being described, $\phi_3$, is used as a precharge phase. For example, the voltage at a certain terminal is automatically precharged to a voltage level representing, for example, logic 1 (true). During the next phase e.g. $\phi_4$, a logic condition from a circuit (not shown) is tested. If the logic condition is true, the voltage level at the terminal ordinarily remains true whereas if the logic condition is false, the voltage level changes to false.

For the present embodiment, therefore, during $\phi_3$, the input terminal 43 and therefore gate electrode 46 are set true. During $\phi_4$, assuming that the input terminal 43 changes from true to false, gate electrode 46 is set false and field effect transistor 42 is turned off. Field effect transistor 31 is turned on by $\phi_{4+1}$ so that capacitor 32 is charged to the voltage level of $\phi_{3+4}$ on terminal 38 while transistor 42 is beginning to turn off. The on resistance of field effect transistor 31 is low enough to enable capacitor 32 to charge very quickly before the voltage at node 41 increases (negatively) significantly from ground potential. When transistor 42 is turned completely off, the voltage at node 41 increases (negatively) to approximately −V since transistor 30 is conductive. The increase in voltage at node 41 is fedback across capacitor 32 to boost the voltage on gate electrode 34 as previously described in connection with constant current source circuit 2, for enhancing the conduction of field effect transistor 30. As a reult, the node 41 is driven to approximately −V for turning field effect transistor 5 on.

During $\phi_{3+4}$ field effect transistor 23 is also turned on for rendering field effect transistor 21 conductive. As a result, node 20 is connected to electrical ground and field effect transistor 1 is turned off. Therefore, no current is supplied through field effect transistor 1 to the output while field effect transistor 5 is turned on for discharging the output. Therefore, the output can be relatively quickly discharged without unnecessary consumption of power due to field effect transistor 1 remaining on.

However, if the input voltage level at terminal 43 had remained true during $\phi_4$, field effect transistor 42 would have remained on such that field effect transistors 5 and 21 would not have become conductive during $\phi_4$ and node 20 and the output would have remained unchanged. The input voltage level therefore is not inverted through the driver.

Figure 2:
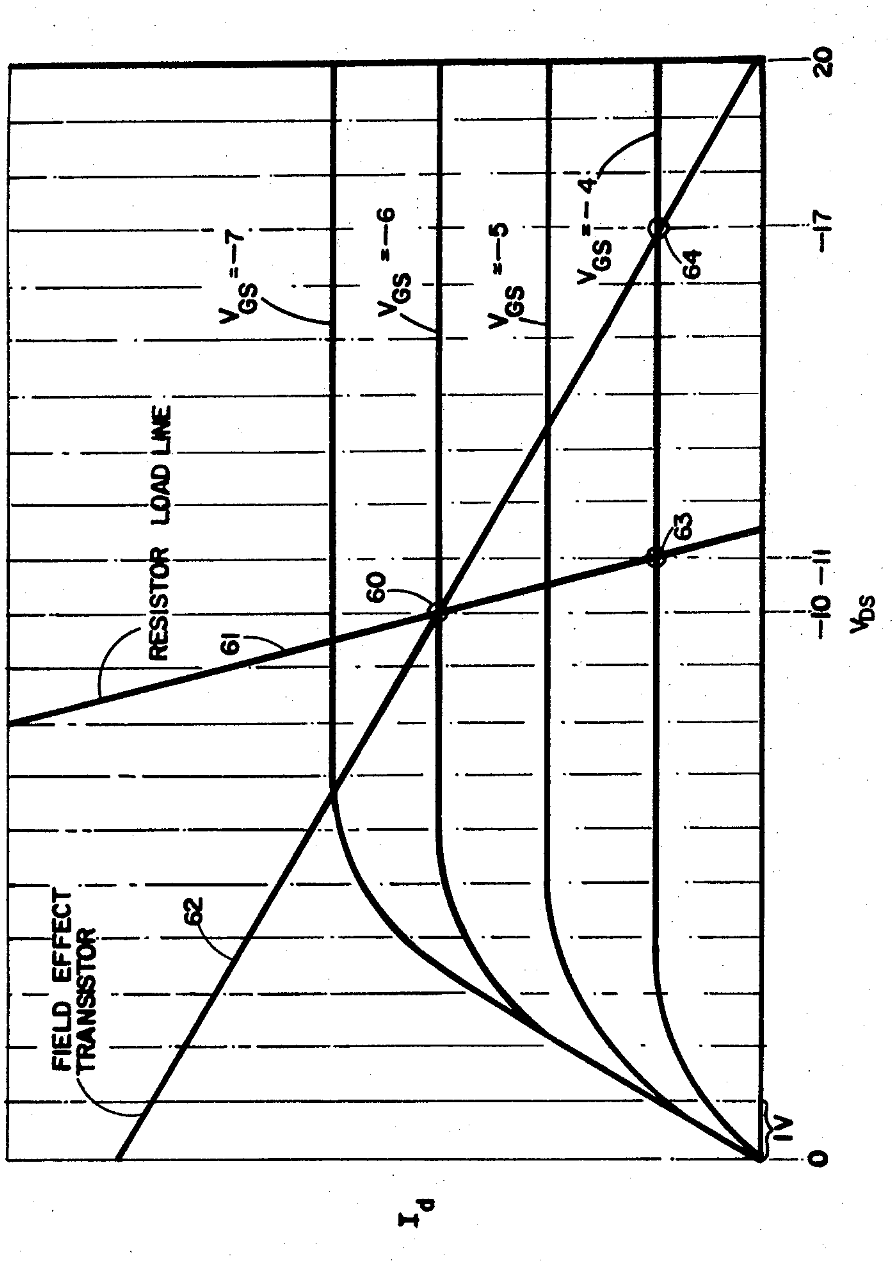
FIG. 2 is a representation of operating characteristics of the high gain field effect transistor amplifier shown in FIG. 1. The characteristics are not intended to represent actual operating characeristics and are used merely to illustrate the amplification principle of the FIG. 1 circuit.

The operation of the high voltage gain amplifier 8 can best be understood by referring to FIG. 2 in view of FIG. 1. Briefly, if the output voltage at terminal 6 is reduced, the voltage on gate electrode 19 of field effect transistor 18 is also reduced and the drain current through field effect transistor 18 is also reduced. When the drain current is reduced, the voltage at node 20 increases negatively for providing an increased drive voltage to gate electrode 7 of field effect transistor 1. The increased drive voltage on the gate electrode 7 increases the current through field effect transistor 1 so that the output 6 is driven to a higher voltage level. Therefore, the output voltage is regulated at the desired output voltage level by the field effect transistor 18. The regulating effects of the high gain amplifier takes place subatantially within the true period of one of the clock signals. As a result, the operation of the circuit is not affected.

A comparison of the utilization of the field effect transistor load (circuit 2) instead of a resistor load can be seen by referring to FIG. 2. Assuming that the gate to source voltage ($V_{gs}$) of the regulating field effect transistor 18 is 6 volts, the operating point is thus established at point 60 along load lines 61 and 62. In order to illustrate the high gain effects, the resistor load line 61 and the field effect transistor load line 62 have been drawn through the same point. The field effect transistor load line 62 roughly corresponds to the load line of the constant current source circuit 2 of amplifier 8.

Assume that the gate-source voltage on gate electrode 19 changes from −6V to −4V, the drop across the field effect transistor 18 increases from approximately −10 volts to approximately −11 volts for a resistor load line. The new operating point is designated by numeral 63 on the resistor load line 61. However, for a field effect transistor load, the voltage across the field effect transistor 18 changes from approximately −10 volts to approximately −17 volts. Therefore, for a change of 2 volts on the gate electrode of the regulating field effect transistor 18, using the circuit 2 as a current load, an increase in the voltage at node 20 of 7 volts can be obtained.

The increased drive voltage, greater than one threshold voltage level, substantially enhances the conduction of field effect transistor 1 to very quickly reset the output 6 to the approximately −6 volts originally assumed. However, if a resistor load had been utilized the change of the voltage at node 20 would have been only one volt which would be less than the amount to substantially enhance the conduction of field effect transistor 1. The operating point along load line 62 for the change in gate voltage from −6V to −4V is identified by the numeral 64.

Under certain operating conditions, it is desired to node, i.e.,electrically connect,output 6 to other circuits similar to the FIG. 1 circuit. For that operating condition, the terminals 26 and 43 are connected to electrically true signals so that field effect transistors 27 and 42 are held on for preventing drive voltages from being applied to gate electrode 7 and 40 of field effect transistors 1 and 5 respectively.

There are ordinarily two reasons for disabling the precharge circuit 1 prior to the phase when the output 6 may be switched from a true to a false logic level as a function of the logic level on the input terminal 43 during $\phi_4$. It is desired to prevent transistors 1 and 5 from being turned on at the same time to prevent an increase in the power dissipation in the transistors and to reduce the time required for transistor 5 to discharge the load capacitor 51 to electrical ground.

In addition, it is desired to disable the precharge circuitry 1 such that the output at node 6 can be connected to the output of one or more other drivers similar to FIG. 1. By disabling the precharge circuitry 4 and the input evaluation circuit 3, the load capacitance 51 can be time shared,i.e., utilized or controlled by the other drivers whose precharge and evaluation circuits have not been disabled. The capability of enabling output 6 to be electrically connected to other drivers and conditionally controlled by other drivers may be referred to as providing a conditional nodability capability. As a general rule, the output 6 is precharged before the precharge circuit is disabled. In that manner, the voltage level at output 6 is controlled by the input signal on a terminal such as terminal 43 of the driver controlling the output during the period the output is controlled by the other drive circuits.

For the embodiment described and shown, P channel, MOS field effect transistors were used. It should be understood that N channel MOS, MNOS, CMOS, silicon gate and other types of devices can also be used without departing from the scope of the invention.

We claim:

1. A field effect transistor circuit comprising:

a field effect transistor bootstrap circuit in electrical series with a regulating field effect transistor having its gate electrode connected to an output terminal;

an output field effect transistor connected in electrical series between a voltage source and said output terminal and having its gate electrode connected to a common point between said bootstrap circuit and said regulating field effect transistor;

clocked field effect transistor circuit means for establishing initial voltage conditions at said common point during a first circuit operating period;

said bootstrap circuit including capacitor means actuated by said initial voltage conditions for driving said common point to a voltage level sufficient to render said output field effect transistor conductive during a second circuit operating period whereby said output terminal is driven to a desired output voltage level, said desired output voltage level being fed back via the gate electrode of said regulating field effect transistor for controlling conduction of said regulating field effect transistor;

said bootstrap circuit and said regulating field effect transistor having a resistance ratio for establishing a drive voltage level at said common point in response to the fed back voltage level, said drive voltage level being sufficient to render said output field transistor less than completely on whereby a change in the output voltage level causes a corresponding change in said resistance ratio for changing said drive voltage level at said common point; and said output field effect transistor being responsive to such change in said drive voltage level for regulating the output voltage to restore said desired output voltage level.

2. A field effect transistor circuit for regulating a desired voltage level at an output terminal, said circuit being controlled by multiple phase clocking signals for establishing a multiphase operating cycle and comprising: a field effect transistor current source circuit and an output voltage regulating field effect transistor connected in electrical series with said current source circuit, the gate electrode of said regulating field effect transistor connected to receive feedback voltages from said output terminal, said current source circuit and said regulating field effect transistor having an impedance ratio for providing a drive voltage level at a common point between said current source circuit and said regulating field effect transistor, said impedance ratio and said drive voltage level being changed in response to changes in the voltage level at said output;

a first output field effect transistor connected in series between a potential source and said output terminal and having a gate electrode connected to said common point, the drive voltage level at said common point providing a drive voltage for said first output field effect transistor, said impedance ratio being selected for enabling the drive voltage of said first output field effect transistor to be changed as a function of the voltage fed back from said output terminal to establish said desired voltage level at the output terminal and to restore said desired voltage level by enhancing conduction of said first output field effect transistor in response to a change in said desired voltage level;

field effect transistor circuit means initially establishing a drive voltage level at said common point, said field effect transistor circuit means including means gated during a first phase of said operating cycle for connecting said common point to a first voltage level, said first voltage level rendering said first output field effect transistor nonconductive;

said current source circuit comprising first and second field effect transistors with said first field effect transistor having a first electrode connected to said common point, and a second electrode connected to a voltage source, a capacitor connected between said first electrode and the gate electrode of said first field effect transistor, said second field effect transistor having a first electrode connected to the gate electrode of said first field effect transistor and having its gate electrode and a second electrode connected to said voltage source whereby when said common point is connected to said first voltage level, said second field effect transistor is rendered conductive for charging said capacitor to the difference between said first voltage level and the voltage level of said voltage source;

said field effect transistor circuit means including means for disconnecting said common point from said first voltage level during a second phase of said operating cycle whereby said current source circuit provides drive voltage to the gate electrode of said first output field effect transistor for rendering said first output field effect transistor conductive whereby said output terminal is initially charged to said desired voltage level;

an input terminal for receiving input signals and an input evaluation circuit connected thereto;

a second output field effect transistor connected to said output terminal in electrical series with the first output field effect transistor, said second output field effect transistor having a gate electrode; and said input evaluation circuit including means connected to the gate electrode of said second output field effect transistor for rendering said second output field effect transistor nonconductive as said output terminal is being charged to said desired voltage level by said first output field effect transistor, said input evaluation circuit further including means responsive to said input signals for providing a driving voltage on the gate electrode of said second output field effect transistor during a subsequent phase of said operating cycle for controlling the voltage level at said output terminal during said subsequent phase, said driving voltage rendering said second output field effect transistor conductive for discharging the voltage at said output terminal if said input signal has a first value during said subsequent phase, and said driving voltage rendering said second output field effect transistor nonconductive if said input signal has a second value during said subsequent phase whereby said output terminal remains at said desired voltage level.

3. The circuit recited in claim 2 further including a field effect transistor connected between the gate electrode of said second output field effect transistor and the means for connecting of said field effect transistor circuit means and having its gate electrode connected to a clocking signal for rendering it conductive at least during said subsequent phase whereby if said driving voltage on the gate electrode of said second output field effect transistor renders said second output field effect transistor conductive to discharge said output terminal said common point is connected to said first voltage level for rendering said first output field effect transistor nonconductive whereby said output terminal is enabled to be discharged from said desired voltage level relatively quickly without unnecessary power dissipation through said first output field effect transistor.

* * * * *